United States Patent [19]
Forrest

[11] 4,084,210
[45] Apr. 11, 1978

[54] ELECTRICALLY INTEGRATED CIRCUIT PACKAGES

[75] Inventor: Nicholas Barnett Forrest, Keyworth, England

[73] Assignee: Plessey Handel und Investments A.G., Zug, Switzerland

[21] Appl. No.: 715,106

[22] Filed: Aug. 17, 1976

[30] Foreign Application Priority Data

Nov. 28, 1975 United Kingdom ............... 48930/75

[51] Int. Cl.² ............................................. H05F 3/02
[52] U.S. Cl. ..................................... 361/212; 206/331
[58] Field of Search ................. 361/212, 220; 339/19; 206/328, 331; 174/52 FD

[56] References Cited

U.S. PATENT DOCUMENTS

| 3,441,853 | 4/1969 | Bodine | 206/331 X |
| 3,908,153 | 9/1975 | Cason, Jr. | 361/220 |

Primary Examiner—Harry E. Moose, Jr.
Attorney, Agent, or Firm—Fleit & Jacobson

[57] ABSTRACT

An electrical integrated circuit package protector capable of protecting an integrated circuit chip, which accommodates a metal-oxide-silicon transistor, and which is enclosed in a package to be protected by the protector, from damage by static electricity appearing at soldering tags which are connected to the chip; which protector comprises a girdle capable of encompassing the package to be protected, and when the package is encompassed by the girdle, both of making detachable physical engagement with the package, and of establishing electrical connection between the soldering tags of the package.

9 Claims, 4 Drawing Figures

ELECTRICALLY INTEGRATED CIRCUIT PACKAGES

The invention relates to electrical integrated circuit packages, which include a chip accommodating a metal-oxide-silicon transistor, and is particularly concerned with protecting the chip from static electricity.

It is known to enclose in a package an electrical integrated circuit chip which accommodates a metal-oxide-silicon transistor. The package affords physical protection for the chip, is of a size which is easy to handle, and serves as a support for soldering tags by which electrical connection may be established with the circuits accommodated in the chip.

When such a package is handled, static electricity may be generated on the soldering tags. If this occurs, the chip suffers damage. Accordingly, whenever such packages are handled, precautions are taken to prevent the generation of static electricity. Known precautions are elaborate, inconvenient and expensive. They include the provision of plant to ensure that packages are only handled in ionised air, or the provision of special clothing for operators handling the packages, and the provision of facilities which ensure that the operators are electrically at earth potential.

According to the invention there is provided an electrical integrated circuit package protector, capable of protecting an integrated circuit chip, which accommodates a metal-oxide-silicon transistor, and which is enclosed in a package to be protected by the protector, from damage by static electricity appearing at soldering tags which are connected to the chip; which protector comprises a girdle capable of encompassing the package to be protected, and, when the package is emcompassed by the girdle, both of making detachable physical engagement with the package, and of establishing electrical connection between the soldering tags of the package.

By providing electrical connection between the soldering tags of a package, a protector ensures that no potential difference is applied to the circuits accommodated in the chip. In this way the chip is protected from damage by static electricity. It is important to note that the combination of a package and a protector is tolerant of static electricity. For this reason the combination may be handled in a conventional manner and precautions against the generation of static electricity are no longer necessary.

An embodiment of the invention will now be described with reference to the accompanying drawings in which.

The drawings are appreciably enlarged, but are not to scale.

Figure 1:
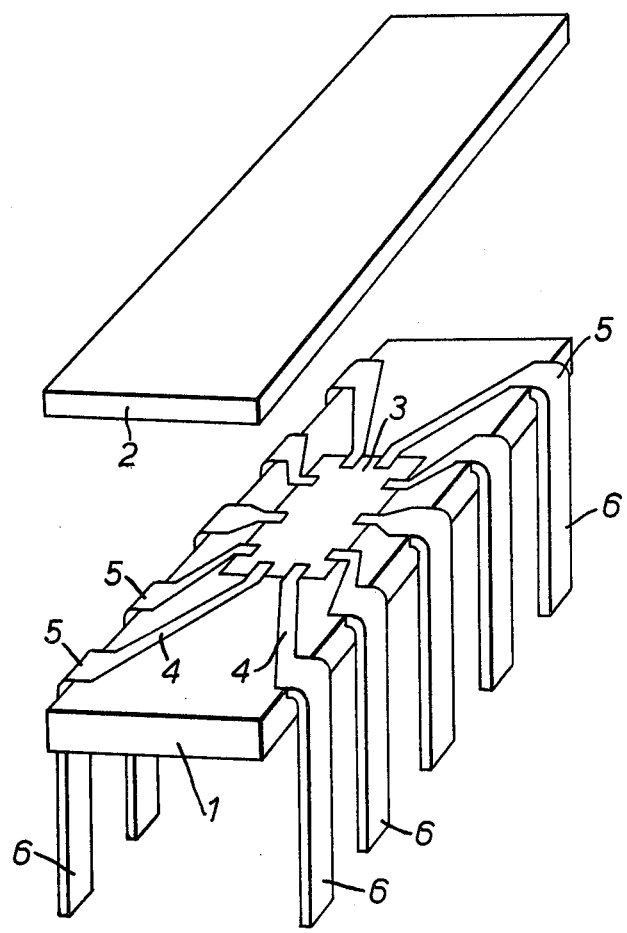
FIG. 1 is an exploded perspective view of a known integrated circuit package.

As shown in FIG. 1, a known package includes a base 1 and cover 2 in the form of rectangles of insulating material. An integrated circuit chip 3 is received in a recess in the base 1. A number of conductors 4 is provided. Each conductor 4 is connected at one end to the chip 3. From the chip 3, a conductor 4 is led, in a duct in the base 1, to the periphery of the base, whence it projects a short distance before turning downwardly through a right angle as shown at 5. From the bend 5, a conductor 4 extends downwardly for a distance sufficient for the extension 6 to serve as a soldering tag. To complete the package, the cover 2 is placed on top of the base 1, and is secured thereto in any convenient way, for example by adhesive. With the base and cover secured to each other, the chip 3 and conductors 4 are anchored in position. The conductors 4 are made of a slightly resilient material which allows the extensions 6 to yield to and recover from accidental impact with other bodies.

When these packages are handled, the extensions or soldering tags 6 can pick up static electricity from various sources, such as friction with the finger of an operator handling the package. Since each tag 6 is part of a conductor 4 which is connected to the chip 3, the static electricity is passed immediately to the chip, in which potential differences are developed which are very frequently great enough to damage the chip. For this reason it is customary to take precautions against the generation of static electricity, as already mentioned.

Figure 2:
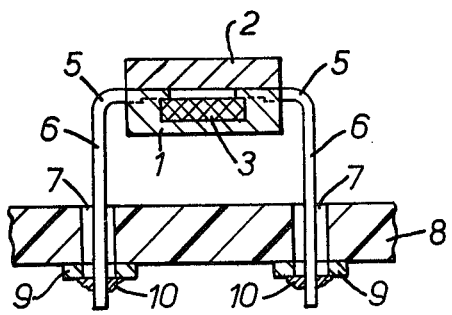
FIG. 2 is a sectional view of the known package of FIG. 1 mounted in known manner on a known printed circuit board.

One common handling operation is that of mounting the package on a printed circuit board. To mount the package the extensions 6 are passed through holes 7 (FIG. 2) in a printed circuit board 8, so that the body 1 and cover 2 are above the board, and the free ends of the extensions 6 project below the board. On the underside of the board 8, the holes 7 are surrounded by conductive annuli 9 which form part of the circuitry printed on the board 8. The mounting is completed when the ends of the extensions 6 are united with the respective annuli 9 by solder 10. Precautions against generating static electricity must be observed throughout the mounting operation.

Figure 3:
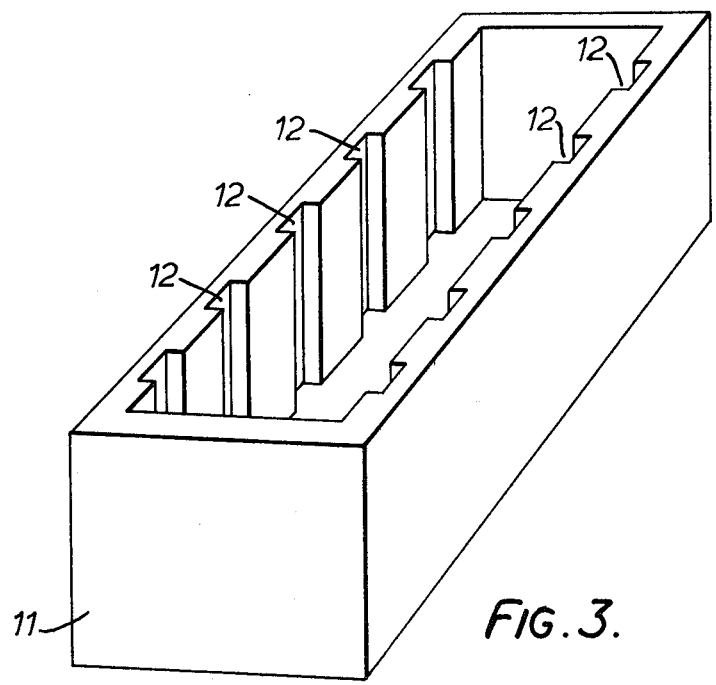
FIG. 3 is a perspective view of a protector according to the invention.
Figure 4:
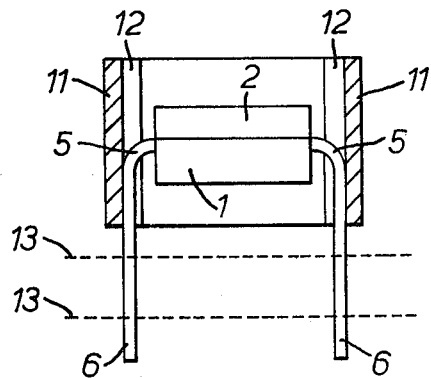
FIG. 4 is a part-section view of the protector of FIG. 3 in detachable engagement with the package of FIG. 1

A protector according to the invention, which is capable of protecting the package of FIG. 1 comprises a girdle 11 or enclosing wall, as shown in FIG. 3. The girdle 11 has a rectangular configuration in conformity with the rectangular shape of the base 1 and cover 2. The girdle 11 is dimensioned so that the package can be placed inside the girdle. The interior surface of the girdle 11 has a recess 12 in respect of each conductor 4. To protect the package, the girdle 11 is moved downwardly over the package, the bends 5 of the conductors 4 entering the respective recesses 12. The downward movement is continued until sufficient of the extensions 6 has entered the relevant recesses 12 for the package to be firmly engaged by the girdle 11. These conditions are depicted in FIG. 4, where the girdle 11 encompasses the package about the base 1 and cover 2, the remainder of the extensions 6 protruding below the girdle 11. The engagement of the package by the girdle 11 is enhanced by the resilience of the material of which the extensions 6 are made.

Preferably the girdle 11 is made of conductive material such as aluminium. When, in this event, the girdle 11 is in position in engagement with the package, the girdle 11 establishes electrical connection between the extensions or soldering tags 6. Thus no potential difference can exist between any two of the extensions 6, and no potential difference can therefore be appled from the extensions to the chip 3 (FIG. 1). Hence, as long as the package is emcompassed by the girdle, the chip 3 is protected from damage by static electricity appearing at the extensions 6, and the precautions at present practised are unnecessary.

The girdle 11 can remain in position while the package is mounted on a printed circuit board. The mounting operation is the same as that described in connection with FIG. 2, the broken lines 13 in FIG. 4 indicating the position of the printed circuit board 8. With the girdle encompassing the package, none of the conventional precautions are necessary. When the mounting operation has been completed, the girdle may be removed by lifting it upwardly from the package. Removal may be affected at any convenient time. If desired, removal may be delayed until the board with the package mounted thereon, has been transported to its ultimate working site.

Alternative constructions of the girdle 11 are possible. For example, the girdle may be made of nonconductive material provided that a continuous band of conductive material is painted or otherwise provided on the interior surface of the girdle where contact is made with the extensions 6. In another alternative, the girdle 11 may be a push-fit around the cover 2, the bottom of the wall making contact with the conductors 4 between the cover 2 and the bends 5. If the girdle 11 is not conductive, the bottom of the girdle must be made conductive by painting with conductive material, or in some other suitable way.

However the simplest arrangement is to make the girdle of conductive material as already described. This permits a one-piece girdle which can be manufactured as an extrusion from which individual girdles can be cut at will.

What is claimed is:

1. An electrical integrated circuit package protector for use in combination with a semiconductor package, said semiconductor package comprising an integrated circuit chip and soldering tags spaced at predetermined intervals around said integrated circuit chip, each of said soldering tags connected to said integrated circuit chip, said protector comprising a girdle, said girdle comprising a plurality of walls connected together to define an enclosed space for accommodating said semiconductor package, a plurality of recesses in said walls spaced apart at predetermined intervals corresponding to said predetermined intervals of the soldering tags, electrical contact means in each said recess and means for electrically connecting together each said electrical contact means such that on insertion of said semi-conductor package in said protector the soldering tags will be within said recesses and held at the same electrical potential.

2. An electrical integrated circuit package protector as claimed in claim 1 wherein the package is constructed from first and second parts, the first part being a base which accomodates an integrated circuit chip, and the second part being a cover which is superimposed upon the base, such that the integrated circuit chip is totally enclosed.

3. An electrical integrated circuit package protector as claimed in claim 2, wherein the soldering tags are L-shaped, wherein one limb of each of the L-shaped tags extends from the interface between the first and second parts of the package and is connected at the free end thereof to the chip, wherein the other limb of each of the L-shaped tags is substantially perpendicular with respect to the package.

4. An electrical integrated circuit package protector as claimed in claim 3 wherein at least the interior surface of the girdle is constructed from a conductive material.

5. An electrical integrated circuit package protector as claimed in claim 3 wherein at least a continuous band of the interior surface of the said girdle is constructed from a conductive material.

6. An electrical integrated circuit package protector as claimed in claim 1 wherein at least the peripheral surface at least one end of the said girdle is constructed from a conductive material.

7. An electrical integrated circuit package protector as claimed in claim 4 wherein the girdle is dimensioned so that the package can be fitted inside the said girdle in a manner whereby the said package lies on the equitorial plane of the said girdle such that electrical connection is established between the said other limbs of the L-shaped soldering tags and the interior surface of the said girdle, a portion of the said other limbs of the soldering tags extending below the said girdle.

8. An electrical integrated circuit package protector as claimed in claim 6, wherein the girdle is dimensioned so that the package can be fitted inside the said girdle in a manner whereby electrical connection is established between the said peripheral surface of girdle and the said one limb of each of the L-shaped tags.

9. An electrical integrated circuit package as claimed in claim 1 wherein said plurality of walls are connected together in the shape of a rectangular prism wherein opposite side walls are parallel to each other, and wherein said plurality of recesses are parallel to each other.

* * * * *